(12) United States Patent
Exeter

(10) Patent No.: US 6,587,007 B2
(45) Date of Patent: Jul. 1, 2003

(54) RING TOPOLOGY BASED VOLTAGE CONTROLLED OSCILLATOR

(75) Inventor: George Ronald Exeter, Livingston (GB)

(73) Assignee: Micrel, Incorporated, San Jose, CA (US)

( * ) Notice: Subject to any disclaimer, the term of this patent is extended or adjusted under 35 U.S.C. 154(b) by 47 days.

(21) Appl. No.: 09/994,181

(22) Filed: Nov. 26, 2001

(65) Prior Publication Data

US 2003/0098747 A1 May 29, 2003

(51) Int. Cl.$^7$ .............................................. H03B 27/00
(52) U.S. Cl. ......................................... 331/57; 331/144
(58) Field of Search .............................. 331/57, 177 R, 331/135, 144

(56) References Cited

U.S. PATENT DOCUMENTS 4,789,976 A  * 12/1988 Fujishima ................. 369/53.33
5,561,398 A  * 10/1996 Rasmussen ................ 331/36 C
5,668,505 A  *  9/1997 Vu et al. ....................... 331/49
6,137,370 A  * 10/2000 Yamamoto .................... 331/57
6,204,733 B1 *  3/2001 Cai ......................... 331/108 B

* cited by examiner

*Primary Examiner*—Robert Pascal
*Assistant Examiner*—Joseph Chang
(74) *Attorney, Agent, or Firm*—Dorsey & Whitney LLP

(57) ABSTRACT

A VCO includes N delay stages that each contribute 180°/N phase shift at the VCO frequency of interest and provide a tunable selection of at least a fast delay and a slow delay path. Each delay stage includes a delay interpolator that smoothly interpolates between the delay paths within the stage. Each delay stage is coupled to a bandpass frequency selective network that acts as a load and helps filter phase noise. Feedback from the $N^{th}$ delay stage to the first delay stage is via a phase shifter that provides a fixed phase at the frequency of interest of 180° or 0° that is required to sustain oscillation. VCO frequency is determined by the various stage delays and by the load circuit phase response. Individual stage delays are varied by interpolation such that overall VCO frequency control and phase noise performance are enhanced. Multiphase signals are available from the N delay stages.

20 Claims, 4 Drawing Sheets

RING TOPOLOGY BASED VOLTAGE CONTROLLED OSCILLATOR

FIELD OF THE INVENTION

The invention relates generally to closed-loop voltage controlled oscillators (VCO) and more particularly to a topology to reduce phase noise in such oscillators.

BACKGROUND OF THE INVENTION

FIG. 1 depicts a closed loop voltage controlled oscillator (VCO) system 10 employing positive feedback at the frequency of interest, according to the prior art. The transfer function for system 10 is given by:

$$\frac{Y(s)}{X(s)} = \frac{G(s)}{1 - G(s)}$$

where $s=j\omega=2\Pi f$, f is in Hz, and $j=\sqrt{-1}$. System 10 seeks to generate a sustaining, repeatable and spectrally pure tone of frequency $f_o$ when $G(s_o)=+1$. System 10 will continue to generate a steady oscillation of frequency $f_o$ providing the magnitude of the loop gain at that frequency is unity, and providing total phase shift around the loop is zero.

High-speed VCOs are commonly implemented using one or more integrated circuits (ICs) using topologies that include ring oscillators, inductor-capacitor (LC) oscillators, and composite oscillators.

A ring oscillator configuration provides a series of cascaded delay stages, where the output signal from the last delay stage is fed back to the input of the first delay stage. Total delay through the cascaded stages (plus any net inversion of the signal within the system) is designed to satisfy the criteria for sustained oscillation, as noted above. Typically each delay stage has a variable delay governed by an independent input, and oscillation frequency $f_o$ is controlled using such input to vary stage delay. The oscillation frequency for a ring counter can be tuned over a fairly wide range, perhaps 20% to 50% of the nominal center frequency. A ring oscillator topology can be used to output multiphase clock signals since the output from the $n^{th}$ delay stage will be offset a fixed amount of phase relative to the output from the $(n+1)^{th}$ delay stage. Notwithstanding that ring oscillators can exhibit a wide range of frequency and can output multiphase clock signals, ring oscillators tend to exhibit relatively high phase noise as each delay stage transfers input noise over the full bandwidth of the ring oscillator.

FIG. 2 depicts a VCO oscillator system 20 in which feedback network H(s) includes a frequency selective LC circuit. Network H(s) is included in the feedback path in an attempt to reduce VCO phase noise. The resonant frequency $f_o$ of VCO system 20 may be tuned by varying inductor L and/or capacitor C within the H(s) network. Capacitor tuning is often implemented using a varactor or voltage-controlled capacitor in H(s), and varying bias voltage coupled to the varactor. H(s) is essentially an LC bandpass filter, that advantageously can attenuate system noise at frequencies removed from the bandpass region. Thus, including an LC H(s) network in VCO 20 provides a lower phase noise VCO than a ring oscillator topology 10 such as shown in FIG. 1. Unfortunately the tuning range of a varactor-implemented LC oscillator is narrow, typically about 5% to 10% of the nominal center frequency. This limited tuning range results from the limited range of bias voltage available to tune the varactor. Further, voltage tuning an LC oscillator is inherently non-linear due to the characteristics of a varactor. Finally, an LC implemented VCO typically outputs a single phase (or its complement).

Thus far it is seen that a ring oscillator VCO can provide a wide frequency range, and multiphase output signals, but can exhibit excessive phase noise.

On the other hand, a varactor implemented LC VCO can exhibit low phase noise, but provides a relatively narrow and non-linearly tuned range of oscillation, and outputs a single phase signal.

Recent attempts in the prior art have sought to combine the best features of ring oscillator VCOs and varactor implemented LC oscillator VCOs. For example, an LC network can be provided as the load, to improve phase noise, while using a delay stage to generate multiphase output clock signals. However in such hybrid configuration, the tuning range is narrow as the LC network is used as the variable element. Attempts to more broadly tune the VCO by varying bias directly to the delay stage is problematic due to variations in output amplitude, and difficulty in sustaining oscillations. Attempts have also been made to tune the VCO by varying the coupling between stages, and by changing the weighting between stages having two different resonant frequencies. But these approaches have resulted in generation of spurious tones because the oscillator can sustain signals at a number of different frequencies. Exemplary prior art hybrid VCO circuit topologies may be found in T. P. Liu, "A 6.5 GHz Monolithic CMOS Voltage-Controlled Oscillator", ISSCC digest of technical papers, pp. 404–405, Feb. 1999, C. Lam et al., "A 2.6 GHz/5.2 GHz CMOS Voltage-Controlled Oscillator", ISSCC digest of technical papers, p. 402–403, Feb. 1999, and N. Nguyen et al., "A 1.8 GHz monolithic LC Voltage-Controlled Oscillator", IEEE J. SSC, Vol. 27, pp. 444–450, Mar. 1992.

Thus, there is a need for a VCO topology that exhibits good phase noise characteristics, while providing a good range of frequency tuning, and preferably while providing multiple phase outputs.

The present invention provides such a VCO topology.

SUMMARY OF THE INVENTION

The present invention provides a composite VCO that is based on a ring topology, and employs a bandpass frequency selective load circuit to filter phase noise. The ring topology includes a plurality of N delay stages, where each stage provides a tunable selection of at least two delays, e.g., fast delay, slow delay. Each delay stage contributes $180°/N$ or a $360°/N$ phase shift at the VCO frequency of interest. Associated with each delay stage is a delay interpolator that smoothly interpolates between the various delay paths within the stage. Each stage is coupled to a bandpass frequency selective network that acts as a load and helps filter phase noise. Feedback from the $N^{th}$ delay stage to the first delay stage is inverted or not inverted, as needed, to provide the overall 360° phase shift necessary to sustain oscillation at the frequency of interest.

Overall VCO frequency is determined by the various stage delays and by the load circuit phase response. Compared to a varactor tuned VCO, the present invention provides enhanced linearity and flexibility in controlling the frequency, which can be varied over a relatively large range. The individual stage delays preferably are varied by interpolation such that overall stability of the VCO is enhanced. Accurately controlled multiphase signals can be output from the different delay stages. The VCO may be implemented on an integrated circuit (IC).

Other features and advantages of the invention will appear from the following description in which the preferred embodiments have been set forth in detail, in conjunction with the accompanying drawings.

DETAILED DESCRIPTION OF THE PREFERRED EMBODIMENTS

Figure 3:
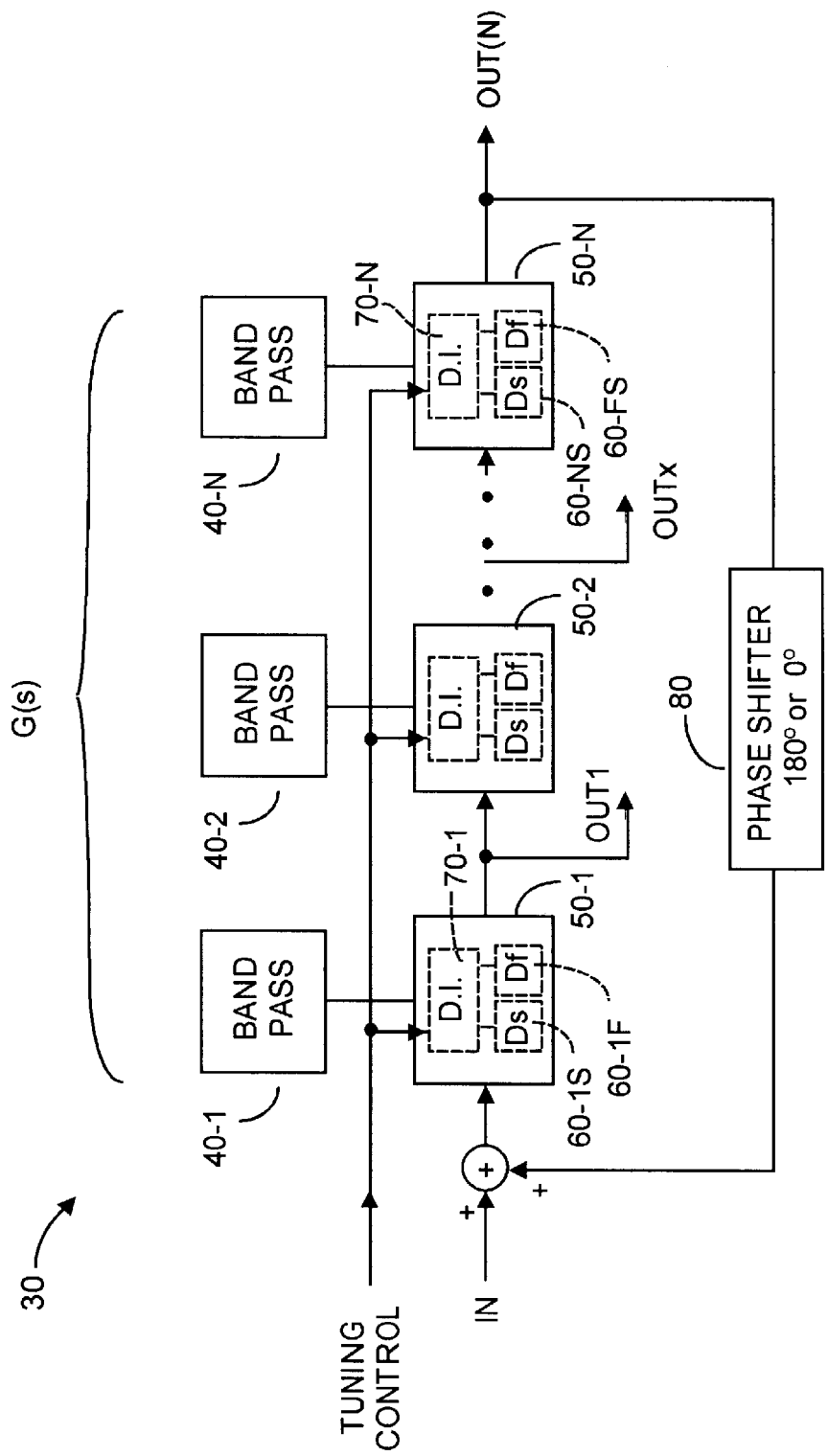
FIG. 3 depicts a modified composite VCO with multiple stages of variable phase delay, according to the present invention.
Figure 4:
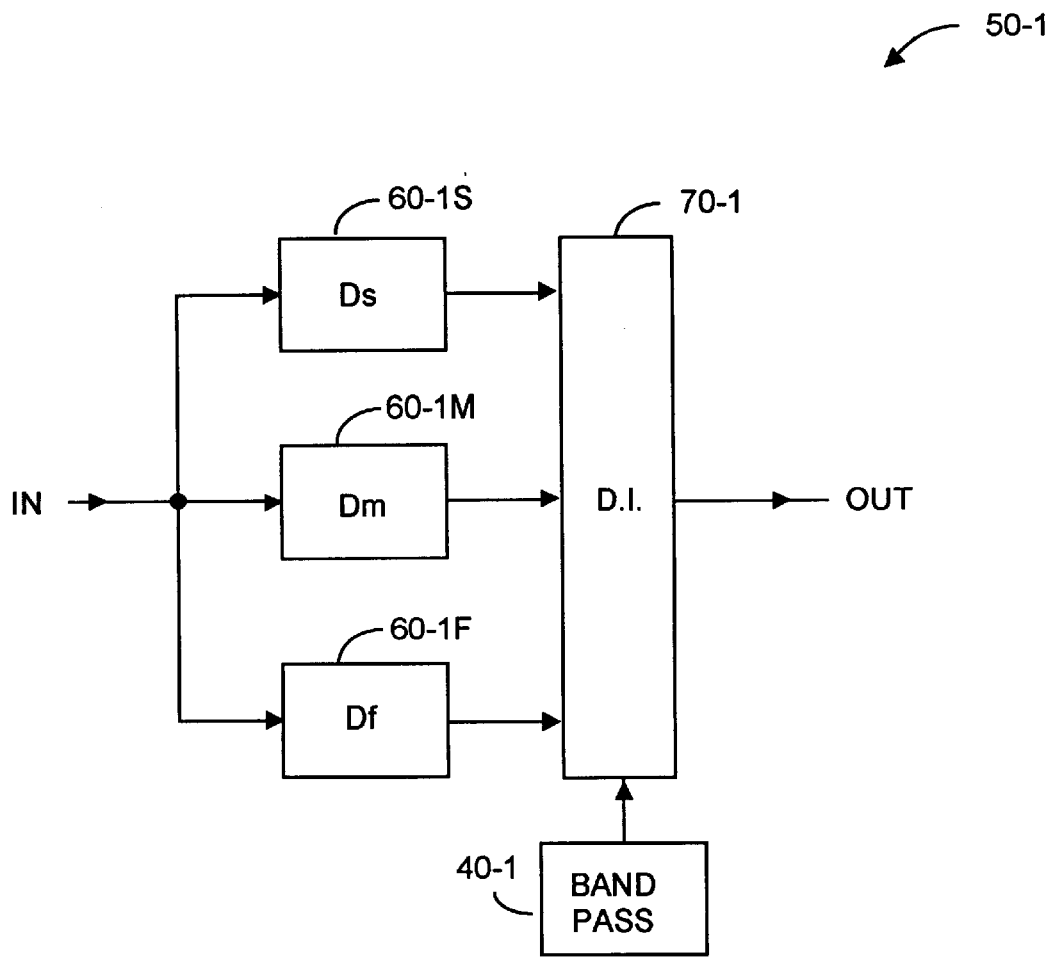
FIG. 4 is an exemplary block diagram of a single variable phase delay stage, according to the present invention.

Referring to FIG. 3, the present invention provides a composite VCO topology 30 that is based on a ring topology, and employs a plurality of bandpass frequency selective networks 40-1, 40-2, . . . 40-N coupled as loads to filter phase noise. The ring topology includes N delay stages 50-1, 50-2, . . . 50-N, where each stage provides a tunable selection of at least two delays, e.g., a slow delay denoted 60-1S (or Ds) and a fast delay denoted 60-1F (or Df). While FIG. 3 depicts the various delay stages 50-x as providing one of two selectable delays Ds, Df, more than two delay selections could of course be provided, as shown in FIG. 4. A delay interpolator, 70-x, denoted D.I., is associated with each delay stage 50-x. (It is understood that "x" is an index, where $1 \leq x \leq N$.)

Figure 1:
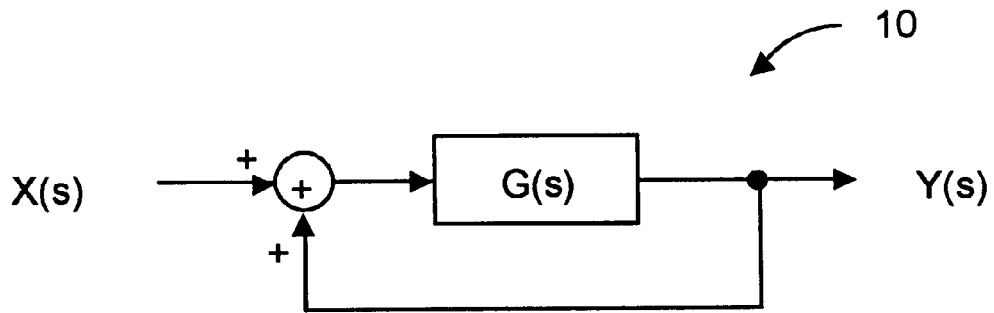
FIG. 1 is a positive-feedback closed loop oscillator system, according to the prior art.
Figure 2:
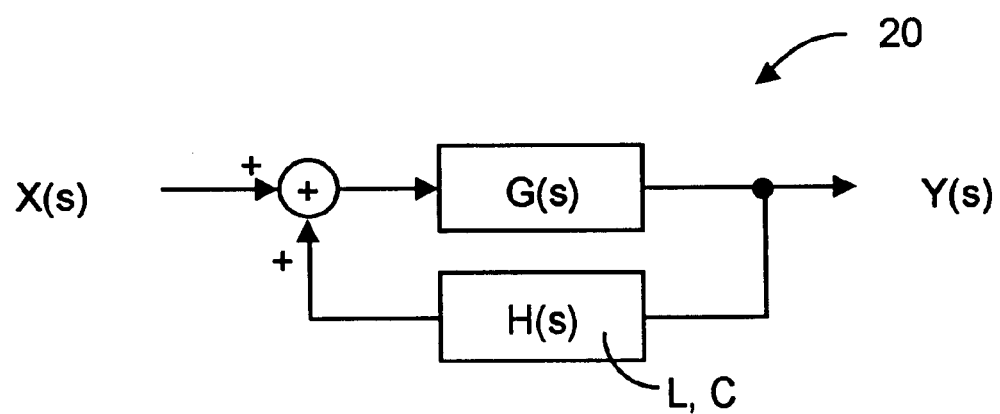
FIG. 2 depicts a closed loop oscillator system in which H(s) includes an LC circuit that resonates at the frequency of interest, according to the prior art.

In VCO 30, the N delay stages 50-1 . . . 50-N are cascaded somewhat similarly to what was shown in FIG. 1, and the output from the last (or $N^{th}$) delay stage 50-N is fed back via a phase shifter 80 to be summed into the input of the first delay stage 50-1. As described below, to sustain oscillation at the frequency of interest, phase shifter 80 will provide a fixed amount of phase shift that is 180° or 0° to ensure overall phase shift of 360°. It should be noted that phase shifter block 80 in FIG. 3 need not be physically present as a separate element. If D1 represents the per stage delay, then one of the following two conditions must be met to sustain oscillation at the frequency of interest:

N·D1+180°=360°, or

N·D1+0°=360°

If phase shifter 80 must provide 180° phase shift, it is understood that the inverted or complementary output from delay stage 50-N may be wired directly to the input of stage 50-1. On the other hand, if 0° phase shift is required, then the non-inverted output from delay stage 50-N may be wired directly to the input of stage 50-1. As such, phase shift element 80 in FIG. 3 represents the presence of either 180° or 0° phase shift from output stage to input stage to ensure 360° phase shift through the entire loop, to sustain oscillation at the frequency of interest.

The variable delay stages 50-1, 50-2, . . . , 50-N combine with the preferably fixed bandpass frequency selective networks 40-1, 40-2, . . . 40-N such that the criteria for oscillation described with respect to FIG. 1 are satisfied. The overall frequency of VCO system 30 is determined by the N stage delays 50-1 . . . 50-N and by the phase response of the associated fixed bandpass frequency selective networks 40-1, . . . 40-N. Great flexibility in selecting the number N of phase delay stages 50-x exists, providing the criteria for oscillation described with respect to FIG. 1 are met. The oscillation output frequency from the $N^{th}$ delay stage 50-N is inversely proportional to the number N of delay stages. In FIG. 3, the amount of phase shift contributed by each of the N stages is 180°/N. Thus if in FIG. 3 there were two delay stages 50-1 and 50-2, each stage would contribute 90° phase shift for a total of 180° phase shift, and inverter 70 would contribute 180° phase shift.

As shown in FIG. 3 and in FIG. 4, an input signal can traverse one of at least two paths in being coupled to the associated bandpass frequency selective network. In the present invention, delay interpolators 70-x smoothly select and interpolate between the different delay paths (e.g., Df, Ds), and combine signals passing through the selected path at the associated fixed bandpass frequency selective network 40-x such that the effective stage delay can be tuned. The delay for a stage is the sum of the interpolated delay signal passing through interpolator 70-x and the delay from the associated bandpass frequency selective network 40-x.

Those skilled in the relevant art will recognize that a bandpass frequency selective network 40-x can be characterized as having a well defined phase vs. frequency curve, or phase vs. bandwidth, or as having a Q factor. Exemplary implementations of a bandpass frequency selective network 40-x can readily have a Q of ten and a bandwidth of 10% of center frequency, but these exemplary parameters may be varied. Typically the Q or the bandwidth of a network 40-x will be designed to match a desired control range of frequency variation. As noted, a lower Q network 40-x can enable a wider variation in skewing the VCO frequency of interest, e.g., up to about ±20% of nominal frequency. Higher Q networks 40-x may reduce the range of frequency variation down to perhaps ±5% of nominal frequency. In general, a wider bandwidth for networks 40-x is preferred, as the resultant lower Q contributes to a broader range of frequency control. Since implementation of some or all of the present invention on an integrated circuit can subject the resultant circuits to many variations due to fabrication processes, a wide tuning range is generally desired. On the other hand, the narrower the bandwidth of networks 40-x (e.g., the higher the Q), the resultant VCO will be more stable and exhibit lower noise. In general, then, network 40-x selectivity is chosen from the appropriate phase vs. frequency response, to match the delay control and tuning range desired.

Since an interpolation method is used, the various paths, e.g., Df, Ds, can be designed for their respective optimum individual operating points. This flexibility avoids unwanted output amplitude variations and stability changes that characterize many prior art topologies that attempt to vary the operating point of a single delay path. Further, delay interpolation also typically provides a much wider tuning range than is available using conventional varactor-tuned LC resonant circuits.

FIG. 4 depicts exemplary delay stage 50-1 in greater detail. In FIG. 4, three rather than two delay paths are shown: a slow delay 60-1S (denoted Ds), a medium delay 60-1M (denoted Dm), and a fast delay 60-1F (denoted Df). Again, it is understood that more or less than three levels of path delay could be provided per stage 50-x. The input signal to stage 50-1 is presented to each delay path 60-1X, 60-1M, 60-1F, and the separately delayed signal from each delay path is input to the associated delay interpolator unit 70-1. As shown, interpolator 70-1 is also coupled to an associated stage bandpass frequency selective network filter 40-1.

Within a phase delay stage 50-x, the various delay paths, e.g., Ds, Dm, Df, may be implemented in a variety of ways providing the paths can be combined to drive the associated fixed bandpass frequency selective network 40-x without impairing functionality of the individual paths. For example, each delay stage may include a single stage transistor transconductance amplifier coupled in parallel with at least two similar series coupled stages whose outputs are matrixed into a common load network circuit. The contribution of the different delay signal paths can be altered by varying the transistor operating bias. For example, the current outputs of a controlling differential pair may be used to provide a weighted combination of, say, two delayed signals as an output signal having a variable delay.

Similarly the fixed bandpass frequency selective networks 40-x can be implemented in a variety of ways, providing the networks can be driven from the associated variable delay stage 50-x, and can in turn drive the following delay stage with signal selectivity having the desired phase response at the desired VCO oscillation frequency. Without limitation, a typical bandpass frequency selective network might be implemented using LC tank circuits, or dielectric resonators, crystals, cavity resonators, surface wave filters. Depending upon how the fixed bandpass frequency selective networks are implemented, VCO 30 may be fabricated upon a single integrated circuit.

Figure 5A:
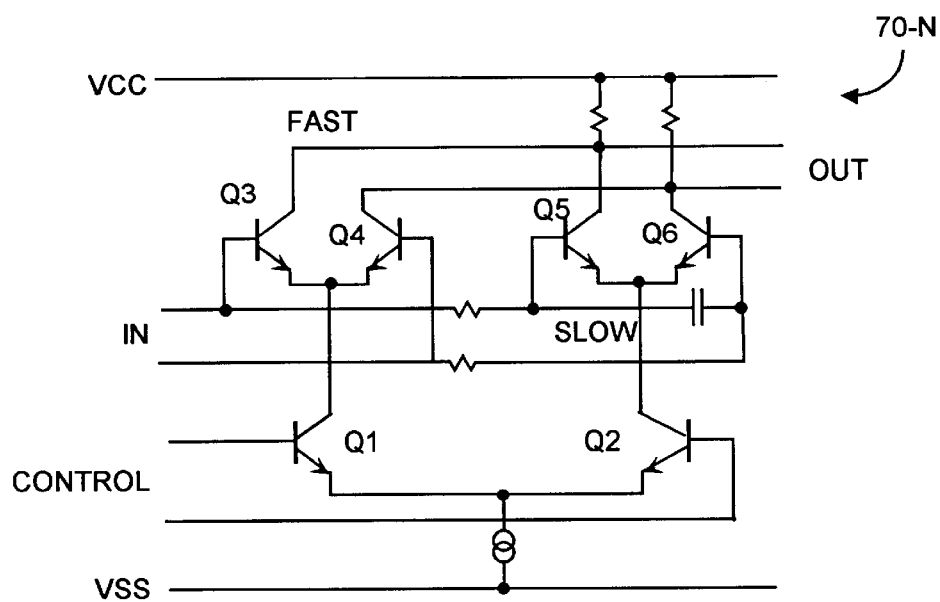
FIG. 5A is an exemplary circuit diagram of a delay interpolator, according to the present invention.
Figure 5B:
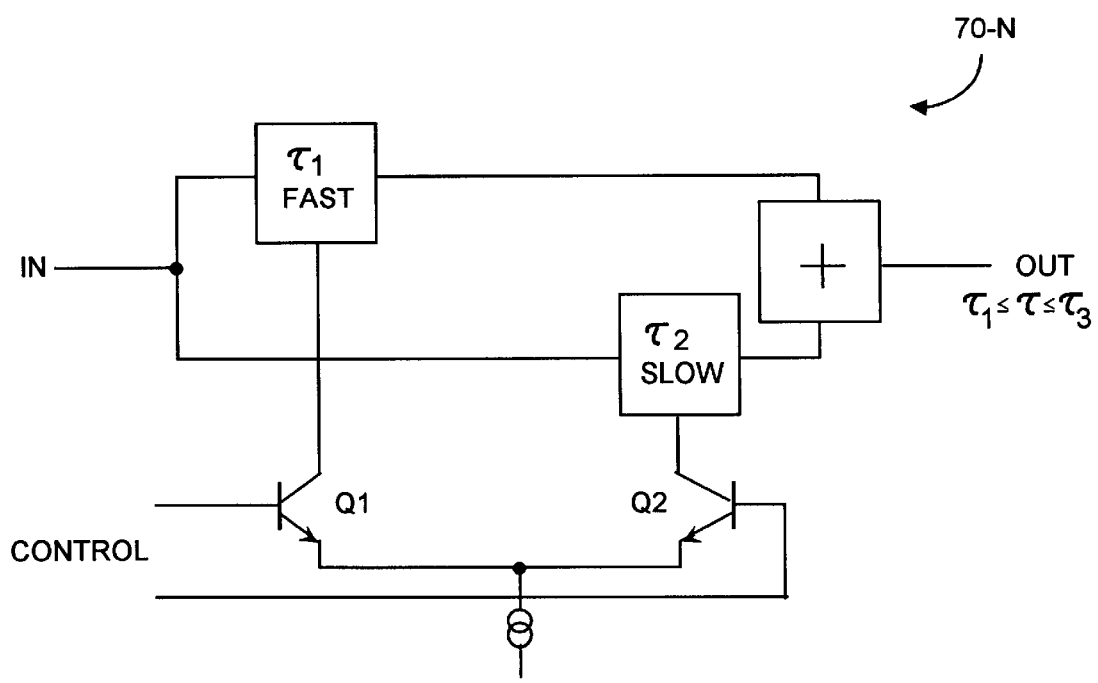
FIG. 5B is an exemplary block diagram for the delay interpolator of FIG. 5A, according to the present invention.

FIG. 5A is an exemplary schematic of a delay interpolator 70-N, here implemented with bipolar transistors coupled in so-called long-tail differential pairs, on a common integrated circuit chip, although other implementations may be used. FIG. 5B is a block diagram of the delay interpolator shown in FIG. 5A. Preferably matched transistors Q3–Q4 provide a fast path (denoted τ1), while preferably matched transistors Q5–Q6 provide a slow path (denoted τ2).

A control signal coupled to the base leads of preferably matched transistor pair Q1–Q2 configured as a transconductance stage controls operation of both the fast and slow path transistor pairs. Using the exemplary circuit of FIG. 5A, a control signal of perhaps only 100 mV to 200 mV range will be sufficient to attain control, compared with a several volt range required by prior art configurations that rely upon varactor tuning control. In essence, transconductance stage Q1–Q2 proportions bias current to fast path stage Q3–Q4 and to slow path stage Q5–Q6 to interpolate linearly to achieve a desired overall delay.

Although FIG. 5A shows a two-path delay stage, more than two paths could be implemented, as exemplified by FIG. 4. Additional amounts of delay per stage is useful, especially where delay interpolation is digitally controlled with a certain granularity. However those skilled in the art of circuit design will recognize that an analog delay control could be used to select two or more delay paths in appropriate linear ratios, to define the overall delay required. In an analog control implementation, control would be continuous such that granularity would not be a concern.

Within a phase shift stage, e.g., stage 50-1, the delay separation between the different paths is preferably matched to the bandpass frequency of the associated selective circuit 40-1. For example, a typical simple selective circuitry may have ±45° phase shift at the −3 dB bandwidth. Best use of this phase shift to promote large tuning range between fast and slow path phase differences can result in a difference of at least about 90° between the fast path and the slow path within a delay stage. Less than 90° or greater than 90° phase shift differentials could be used, depending upon the amplitude response variation in the overall loop gain. As a greater number of bandpass selective circuit blocks are used, a smaller differential fast-to-slow path phase will suffice for the same amplitude and overall frequency variation.

It will be appreciated that applicant's use of at least a fast delay path and a slow delay path in a delay stage, with controlled interpolation between stages, permits each delay stage to be independently designed for best overall operation conditions. As such, a substantially optimum operating point could be designed for a stage, e.g., to achieve high gain with low noise. Each delay stage could be separately optimized, with delay differences being introduced differently in different stages, e.g., use of different loading capacitors within a stage.

Without limitation, the present invention may be used to implement a VCO having a frequency of interest in the range of about 500 MHz to about 50 GHz, when implemented as a monolithic integrated circuit. Multi-phase output signals are available from the various delay stages, e.g., output 1 may be obtained at an interface between stage 1 and stage 2, or indeed at the interface between a delay section 50-1 and its associated bandpass filter section 40-1. VCO frequency excursions of between about ±5% to about ±20% are achievable, especially when using low Q inductors fabricated during a monolithic semiconductor process. Understandably as Q is reduced, a greater range of frequency excursion is attainable.

Those skilled in the relevant art will appreciate that, at a sacrifice in performance, one need not simultaneously interpolate phase for each delay stage 50. For example, it may be desired not to control one or more delay stages, or it may be desired to insert a fixed delay stage within the VCO feedback loop. A ring-structure VCO so designed, where some but not all stages include bandpass selective units and delay interpolating units would still function as a VCO, but less ideally than the embodiments described herein.

Modifications and variations may be made to the disclosed embodiments without departing from the subject and spirit of the invention as defined by the following claims.

What is claimed is:

1. A voltage controlled oscillator (VCO), comprising:
    N series-coupled delay stages, each of said stages providing at least a first delay path and a second delay path and contributing a phase shift at a VCO frequency of interest equal to one of 180°/N and 360°/N, where N is an integer greater than one;
    for each of said N delay stages, a delay interpolator, coupled to interpolate between said first and said second delay path;
    for each of said N delay stages, a bandpass frequency selective network that rejects phase noise for said VCO; and
    a path between a last of said delay stages and a first of said delay stages providing an amount of phase shift selected from 180° and 0°;
    where total phase shift through said VCO is 360° at said VCO frequency of oscillation.

2. The VCO of claim 1, wherein 2≦N≦4.

3. The VCO of claim 1, wherein said VCO is fabricated on a common integrated circuit chip.

4. The VCO of claim 1, wherein said delay interpolator interpolates substantially linearly between at least said first and said second delay path.

5. The VCO of claim 1, wherein of said delay stages includes a transconductance amplifier.

6. The VCO of claim 1, wherein said VCO frequency of oscillation is in a range from about 500 MHz to about 50 GHz.

7. The VCO of claim 1, wherein said VCO frequency of oscillation can be controlled with a control signal by at least ±5%.

8. The VCO of claim 7, wherein magnitude of said control signal is less than about 200 mV.

9. The VCO of claim 1, wherein said VCO frequency of oscillation can be controlled with a control signal by about ±5% to about ±20%.

10. The VCO of claim 9, wherein magnitude of said control signal is less than about 200 mV.

11. An integrated circuit having fabricated thereon a voltage controlled oscillator, comprising:

N series-coupled delay stages, each of said stages providing at least a first delay path and a second delay path and contributing a phase shift at a VCO frequency of interest equal to 180°/N, where N is an integer greater than one;

for each of said N delay stages, a delay interpolator, coupled to interpolate between said first and said second delay path;

for each of said N delay stages, a bandpass frequency selective network that rejects phase noise for said VCO; and a path between a last of said delay stages and a first of said delay stages providing an amount of phase shift selected from 180° and 0°;

where total phase shift through said VCO is 360° at said VCO frequency of oscillation.

12. The integrated circuit of claim 11, wherein said delay interpolator interpolates substantially linearly between at least said first and said second delay path.

13. The integrated circuit of claim 11, further including a transconductance amplifier for each of said delay stages;

wherein variation in a control signal coupled to said transconductance amplifier interpolates delay through each of said delay stages.

14. The integrated circuit of claim 11, wherein said VCO has at least one characteristic selected from a group consisting of (a) said VCO frequency of oscillation is in a range from about 500 MHz to about 50 GHz, (b) said VCO frequency of oscillation can be controlled with a control signal by at least ±5%, and (c) said VCO frequency of oscillation can be controlled with a control signal of less than about 250 mV amplitude.

15. A method of implementing a low phase noise voltage controlled oscillator (VCO), the method comprising the following steps:

(a) series-coupling N delay stages, each of said stages providing at least a first delay path and a second delay path and contributing a phase shift at a VCO frequency of interest equal to one of 180°/N and 360°/N where N is an integer greater than one;

(b) for each of said N delay stages, interpolating between said first delay path and said second delay path;

(c) bandpass filtering each of said N delay stages to reduce phase noise of said VCO; and (d) coupling an output of a last of said delay stages and a first of said delay stages with a phase shift selected from (i) 180° and (ii) 0°, such that total loop phase shift through said VCO is 360° at said VCO frequency of interest.

16. The method of claim 15, wherein $2 \leq N \leq 4$.

17. The method of claim 15, wherein step (b) includes interpolating substantially linearly between at least said first delay path and said second delay path.

18. The method of claim 15, further including:

providing each of said delay stages with a transconductance amplifier; and applying a control signal to vary a characteristic of said transconductance amplifier to vary delay through at least one of said delay stages.

19. The method of claim 18, wherein said transconductance amplifier controls a proportion of delay through each path in one of said delay stages and interpolates substantially linearly to provide a desired delay per stage.

20. The method of claim 19, wherein said VCO has at least one characteristic selected from a group consisting of (i) said VCO frequency of oscillation is in a range from about 500 MHz to about 50 GHz, (ii) said VCO frequency of oscillation can be controlled with a control signal by at least ±5%, (iii) said VCO frequency of oscillation can be controlled with a control signal of less than about 250 mV amplitude, and (iv) said VCO is fabricated on a common integrated circuit.

* * * * *